United States Patent [19]

Karwan

[11] Patent Number: 4,765,784
[45] Date of Patent: Aug. 23, 1988

[54] ELECTRONIC DEPTH CONTROL FOR DRILL

[75] Inventor: Henry P. Karwan, Fountain Valley, Calif.

[73] Assignee: Advanced Controls, Inc., Irvine, Calif.

[21] Appl. No.: 679,119

[22] Filed: Dec. 6, 1984

[51] Int. Cl.⁴ .............................................. B23B 39/08
[52] U.S. Cl. .................................................... 408/13
[58] Field of Search ........................ 408/10, 11, 12, 13

[56] References Cited

U.S. PATENT DOCUMENTS

| | | | |
|---|---|---|---|
| 3,487,730 | 1/1970 | Dohring et al. | 408/10 |
| 4,203,691 | 5/1980 | Nishimura et al. | 408/13 X |
| 4,329,771 | 5/1982 | Eto et al. | 408/11 X |
| 4,396,322 | 8/1983 | Nomura et al. | 408/11 X |
| 4,400,118 | 8/1983 | Yamakage et al. | 408/13 X |
| 4,440,530 | 3/1984 | Yamakage | 408/13 X |
| 4,451,892 | 5/1984 | McMurtry | 408/13 X |
| 4,504,917 | 3/1985 | Grimm et al. | 408/13 X |

Primary Examiner—Z. R. Bilinsky
Attorney, Agent, or Firm—Spensley Horn Jubas & Lubitz

[57] ABSTRACT

A drilling system for drilling circuit boards includes means for precisely controlling the depth of drilling despite surface variations in the circuit boards. The system includes a detection circuit for detecting contact between the circuit board and drill and control circuitry for thereafter causing the drill to move a predetermined distance corresponding to the desired drilling depth.

11 Claims, 2 Drawing Sheets

ELECTRONIC DEPTH CONTROL FOR DRILL

BACKGROUND OF THE INVENTION

1. Field of the Invention

The present invention relates to drilling systems and more particularly to precision drilling systems for drilling into circuit boards. In drilling circuit boards, it is often critical to achieve drilling to a predetermined depth with reference to the surface of the circuit board within a very tight tolerance. For example, in the case where a circuit board being drilled is a laminated board having interleaved layers of metal and insulating substrate, it is often necessary to drill "via" holes to a predetermined metal layer. If the drilled depth is inaccurate, the board may be rendered defective. Another example of a requirement for precise drilling is the situation in which a stack of boards is drilled simultaneously. In order to increase the throughput of the drilling apparatus, the boards are stacked to a thickness which is almost equal to the length of the particular drill bit being used. For very small holes, the drill bit is typically formed with a shank of increased diameter for connection to the drilling spindle. If drilling progresses too far such that the shank contacts the surface of the top circuit board being drilled, the drill bit may well be broken and/or the top circuit board damaged. Thus, precision in drilling depth is required both in the situation of blind drilling to a predetermined depth and in the drilling of through holes in which the thickness of the stack of boards being drilled is close to the flute length of the drill bit being used.

2. Description of the Prior Art

Drilling systems presently employed can achieve very accurate drilling from a starting point. A typical drill may have a resolution of one tenth of a thousandth of an inch. Prior art systems typically provide a predetermined stop to limit downward travel of the drill spindle to achieve desired drilling depth.

Although the drilling mechanism itself has a high degree of resolution, the board surface to be drilled does not. For example, one typical multilayer board has a thickness of two hundred thousandths of an inch (0.2 inches) and it is desired to drill holes having a depth of four and one-half thousandths of an inch within a tolerance of one-half thousandth of an inch. Because of the thickness variations of the board, it is difficult to drill with such precision since the drilling is not referenced to the board but rather to the support surface of the board.

Circuit board drilling systems typically include a pressure foot surrounding the drill bit which contacts the circuit board to hold it in place during drilling. One prior art system provides a feedback sensor attached to the pressure foot to provide a position indication of the feedback sensor, and thus board surface, which is compared to a sensor location of the drill bit. The disadvantage of such a system is that it does not allow for surface irregularities, since the pressure foot contacts the board surface at a point spaced from the actual drilling point. In addition to surface irregularities of the board, debris on the board surface can also interfere with proper drilling. Also, inaccuracies of the positioning sensors can cause the devices to operate unreliably.

SUMMARY OF THE INVENTION

The present invention incorporates means for accurately referencing the drilling operation to the surface of the circuit board being drilled. This is accomplished by actually detecting the point at which the drill bit contacts the surface of the circuit board and controlling further movement of the drill spindle with reference to the determined position. Typically, the circuit boards being drilled are coated with a layer of conductive material, such as copper. In the preferred embodiment of the invention, an electronic detector is employed to detect electrical contact between the drill bit and the circuit board. (If a coating is not used, a conductive overlay may be employed to facilitate the detection). Drilling to a programmed depth is then initiated. By referencing the drilling operation to surface of the workpiece at the exact point where drilling occurs, extremely precise control over the drilling depth can be achieved.

BRIEF DESCRIPTION OF THE DRAWINGS

The invention will be described with reference to the accompanying drawings, wherein.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by reference to the appended claims.

Figure 1:
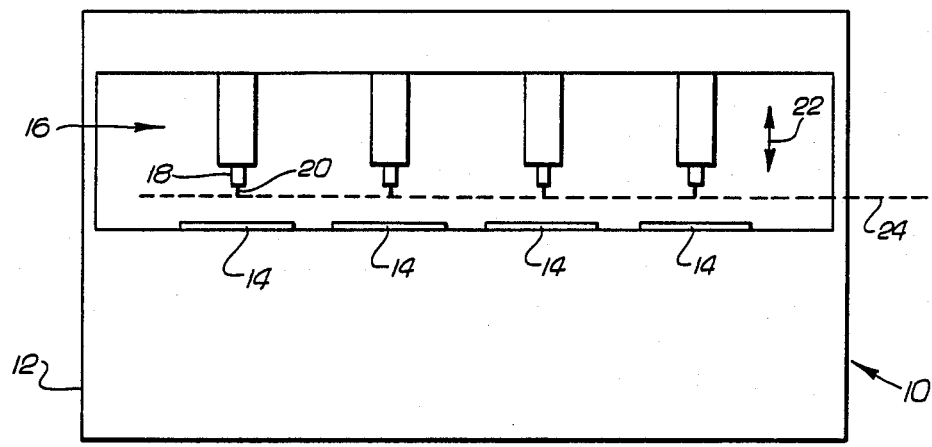
FIG. 1 is a front plan view of a drilling system incorporating four separate drill spindles.
Figure 3:
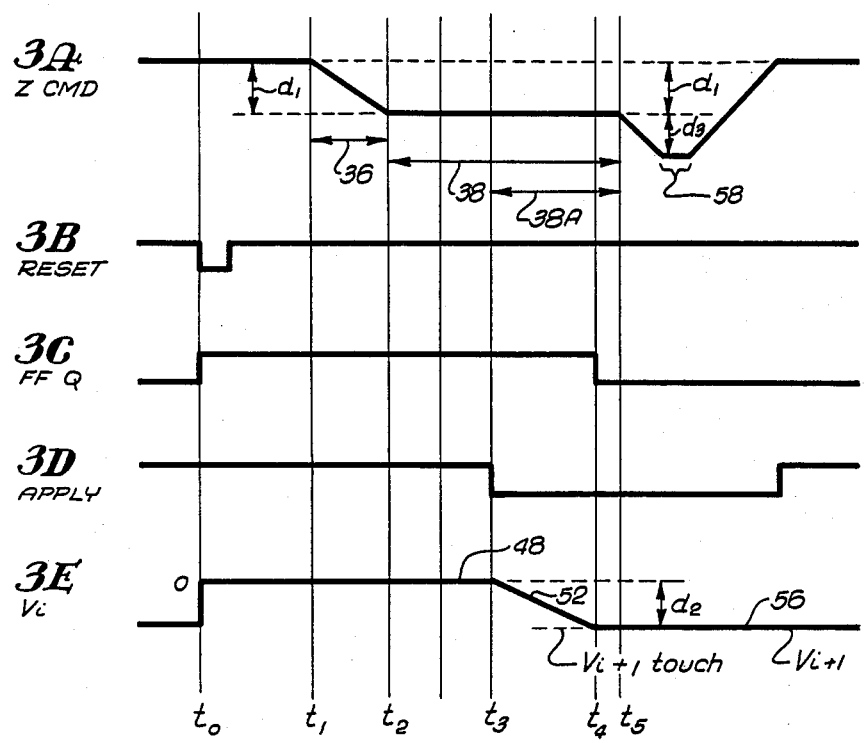
FIGS. 3A–E are waveform diagrams associated with the control system of FIG. 2.

Referring to FIG. 1, a four-drill drilling system 10 includes a base section 12 upon which workpieces such as printed circuit boards 14 are supported. Drills 16 including spindles 18 and bits 20 are supported above the circuit boards 14. Each drill is movable in X and Y axes with respect to its associated printed circuit board so as to enable the board to be positioned for drilling at the desired location. The spindles are movable along the Z axis indicated at 22 so as to achieve drilling.

The drills 16 in FIG. 1 are shown in a "ready" or starting position in which the tips of the drill bits lie along a line 24 chosen so that the drill tips are spaced above boards to be drilled. The drilling system thus far described is conventional and movement of the drill spindles can be controlled to extremely precise tolerances, e.g. on the order of 0.0001 of an inch. However, the surfaces of the circuit boards 14 may not be coplanar and in addition may have individual surface variations. Thus, although drilling of a fixed distance from the starting position line 24 can be achieved with a high degree of precision, this may not result in the desired drilling depth in the circuit boards 14 since the surface of each board will not always be a known fixed distance from the line 24.

The present invention operates to reference each drilling operation with respect to the actual point on the surface of the board at which drilling occurs. This is accomplished by moving the drill spindle toward the board until the drill bit 20 contacts the board. The spindle is then controlled to move a predetermined distance after contact in order to drill holes of the desired depth. In a multiple drilling system as shown in FIG. 1, each of the spindles is moved independently into contact with its associated circuit board. After contact, the drills are moved in tandem to achieve the desired drilling depth with respect to each board, even though the height of the boards at the point of drilling may be different.

Figure 2:
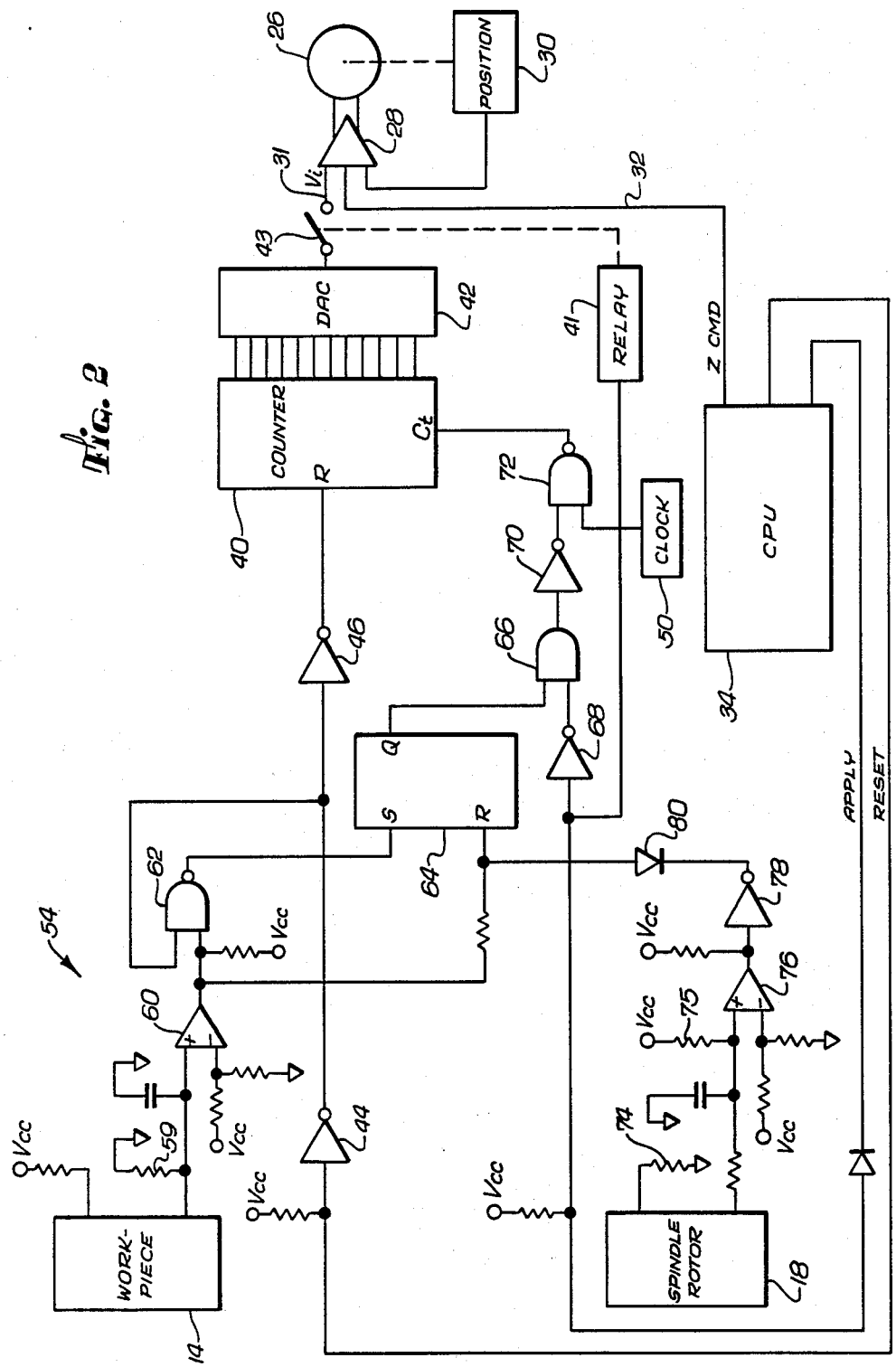
FIG. 2 is a diagram of the control system of the present invention.

The control system for a single spindle is illustrated in FIG. 2, with associated signals being shown in FIGS. 3A-E. The spindle 18 is driven by a drive motor 26 which is in turn driven by a servo amplifier 28. A position encoder 30 provides position feedback information to the amplifier 28 representative of the position of the motor with respect to the starting position. The amplifier 28 receives position command input signals on lines 31 and 32 and provides a drive signal to the motor 26 indicative of the error between the commanded position and the sensed position as indicated by the encoder 30. Many different servo systems could be employed, and the details of operation of the servo will not be described, as they do not form a part of the present invention. In addition, the invention is not limited to servo systems but could also be employed with open loop drive systems.

The operation of the drilling system is controlled by means of a central processing unit 34. Initially, the spindle and drill bit are at the ready or starting position. Upon initialization of a drilling operation at time t0, a reset signal is generated by the CPU 34 (FIG. 3B). The reset pulse is applied to the counter 40 via inverters 44 and 46 to cause the counter 40 to reset to a count which provides a zero output from the converter 42. This is indicated at 48 in FIG. 3E. At time t1 the CPU 34 generates a signal Z Command, or Z CMD, on line 32 to the servo amplifier 28. Lower commanded positions with respect to the starting position are indicated by a downward moving signal. The initial portion of the signal is a position command calling for the spindle to move a predetermined amount from the starting position. This portion of the command is illustrated at 36 in FIG. 3A. Once the desired position has been reached (at time t2), the Z command signal is maintained constant for a predetermined period of time 38. It is during this period of time that the referencing of the drill to the surface of the circuit board is accomplished.

A counter 40 and digital-to-analog converter 42 are employed during the time period 38A to generate an additional position command signal $V_{i+1}$ on line 31 to cause the spindle to move so that the drill bit contacts the surface of the circuit board (where $V_i$ was the position command for the previous drilling operation). The CPU 34 generates an Apply signal at time t3 which causes counting of the counter to be initiated at a rate controlled by a clock 50 and energizes a relay 41 to close a switch 43 to connect the converter 42 to the amplifier 28. As the counter counts, the output of the converter 42 will vary as indicated at 52 in FIG. 3E. The counter continues to count and the signal $V_{i+1}$ varies to result in additional drill spindle movement until the drill bit touches the surface of the circuit board (time t4). Contact between the drill bit and circuit board is detected by means of circuitry 54 which causes the counter to stop counting. The signal $V_{i+1}$ will thus be maintained at a constant level as indicated at 56 in FIG. 3E. The time period 38 of the drill bit and the circuit board surface occurs at time t4 prior to the end of the period 38 at time t5.

At time t5, the combined position command of the signals $V_i$ and Z CMD are at a level where the drill bit is in contact with the circuit board. At this point, the signal Z CMD is varied until it reaches a level 58. The change in the signal Z CMD is by an amount corresponding to the desired depth of drilling into a circuit board. Thus, the overall position command to the servo amplifier 28 during the time period 58 corresponds to a fixed distance $d_1$ accomplished during initial movement of the spindle, a variable distance $d_2$ to move the drill bit into contact with the board surface, and a fixed distance $d_3$ for drilling into the board. After drilling has been accomplished, the Z Command signal returns to its initial level. At the end of the Apply signal the switch 43 is opened. Upon the generation of a subsequent reset signal, the signal $V_{i+1}$ will return to the zero level and the spindle will thus return to its starting position.

The operation of the control circuitry indicated at 54 will now be described in more detail. A supply voltage $V_{cc}$ is applied to the workpiece 14 and sensed by a comparator 60. The inverting input to the comparator is maintained at a voltage lower than the supply voltage $V_{cc}$. Thus, the normal output of the comparator, i.e., before contact with the circuit board, will be high. The comparator 60 will provide a high output, however, only if a good connection between the supply voltage and the material (otherwise the non-inverting input will be zero as a result of the ground connection through resistor 59). The comparator output is applied to one input of a NAND gate 62 and to the reset input of a flip-flop 64. Upon receipt of a reset pulse through the inverter 44, the output of the NAND gate 62 will go low, thus setting the flip-flop 64. The output of the flip-flop 64 is applied to a NAND gate 66. The Apply pulse from the CPU 34 is applied to the other input of the NAND gate 66 through an inverter 68. After the flip-flop 64 is set, i.e., at some point after the reset pulse, the Apply pulse is generated, thus causing the output of the NAND gate 66 to go low. This output is applied to a NAND gate 72 via an inverter 70 and enables the counter 40 to count pulses from the clock 50. As a result, the counter will be incremented and the signal $V_i$ will increase as indicated in FIG. 3E at 52.

The spindle 18 and thus drill bit 20 is grounded as indicated at 74. The ground connection is monitored by means of a comparator 76, the output of which remains low as long as the spindle is grounded, due to the connection of the supply voltage, $V_{cc}$ to resistor 75. This output controls the output of an inverter 78 which will remain high as long as there is a proper ground connection.

When the drill bit contacts the circuit board 14, the circuit board will be shorted to ground, thereby causing the output of the comparator 60 to switch to a low level. This will reset the flip-flop 64 as indicated at t4 in FIG. 3. As a result, the gate 72 will be inhibited and the counter 40 will cease counting clock pulses from the clock 50. The output of the converter 42 will thus remain constant.

If a proper ground connection is not maintained at the spindle rotor 18, the inverter 78 will go low, thus grounding the reset input of the flip-flop 64 through the diode 80 to reset the flip-flop and inhibit further counting by the counter 40. This prevents potentially harmful drill movement when there is a bad ground connection.

The individual circuit components depicted in FIG. 2 are connected as shown and will not be discussed further, since the values and connections are readily derived by those skilled in the art.

Thus, the circuit 54 operates to initiate counting of the counter upon the generation of the Apply pulse by the CPU 34 and ceases counting when the drill bit touches the circuit board. Precise drilling depth is therefore achieved by referencing the actual drilling operation to the surface of the circuit board. This is accomplished by applying either a fixed voltage to either the circuit board or spindle and maintaining the remaining component at ground. When the two elements come in contact with each other, the component having the fixed voltage applied to it will be grounded. This is detected and is used to stop the generation of the position signal. The position signal is then increased by a fixed amount corresponding to the desired drilling depth.

What is claimed is:

1. A drilling system for precisely drilling a fixed distance into a workpiece having a conductive surface, comprising:
   a drill spindle for carrying a drill bit, the drill spindle being movable toward and away from a workpiece;
   drive means for driving the drill spindle;
   means for applying a predetermined voltage to one of the spindle and workpiece and grounding the other of the spindle and workpiece;
   detection means for detecting contact between the drill bit and workpiece by monitoring the voltage of whichever of the spindle and workpiece has the predetermined voltage applied to it and detecting a grounded condition thereof;
   control means for controlling the driving means to control the movement of the spindle, said control means causing the spindle to move toward the workpiece until the detection means detects contact between the drill bit and workpiece and thereafter causing the spindle to move a predetermined distance to drill a desired depth into the workpiece; and
   monitoring means for monitoring the voltage of whichever of the spindle and workpiece is grounded and inhibiting operation of the control means if a defective ground connection is detected to limit movement of the spindle toward the workpiece.

2. A drilling system as in claim 1 wherein the control means includes:
   a servo system for positioning the spindle in accordance with a position input signal;
   a reference position signal generator means for generating a reference position signal which is varied to cause the spindle to move until the detection means detects that the drill bit has contacted the workpiece; and
   drilling signal generator means for generating a drilling position signal to be added to the value of the reference position signal to cause the spindle to move by an additional predetermined amount to drill the workpiece.

3. A drilling system as in claim 1 wherein:
   the drive means comprises a position servo system which positions the spindle in accordance with an input signal representing desired position with respect to a starting position; and
   the control means comprises firat means for generating a first component of the input signal having a value which causes the spindle to move from the starting position to initial contact with the workpiece, and second means for generating a second component of the input signal corresponding to a predetermined amount of movement from the surface of the workpiece to achieve desired drilling depth.

4. A drilling system as in claim 3 wherein the first means comprises means for generating said first component which increases in magnitude until the drill bit contacts the workpiece and thereafter remains constant and wherein the second means comprises means for generating said second component after the drill bit has contacted the workpiece, wherein the first and second components are combined to achieve an amount of spindle movement necessary to drill to a desired depth.

5. A drilling system as in claim 4 wherein the first means comprises:
   a digital to analog converter, the output of which is the first component;
   a counter for providing an input to the digital to analog converter;
   logic means, coupled to the counter and to the detection means, for incrementing the counter when the drill bit is spaced from the workpiece and for stopping the counter in response to the detection of contact between the drill bit and workpiece.

6. A drilling system as in claim 5 wherein the second means comprises a central processing unit, said processing unit generating said second component and being connected to the logic means to control the initiation of counting by the counter.

7. A drilling system as in claim 6 wherein the processing unit generates a third component of the input signal prior to the generation of the first and second components, said third component causing the spindle to move a predetermined distance from the starting position, wherein the processing unit subsequently initiates the counting of the counter to cause the generation of the first component.

8. A system as in claim 1 wherein the detection means includes a comparator for comparing the voltage on whichever of the spindle and workpiece has the predetermined voltage applied to it with a reference voltage and providing a contact signal to the control means when the compared voltage falls below the reference voltage, the control means initially causing the spindle to move toward the workpiece until the contact signal is received and thereafter causing the spindle to move toward the workpiece by the predetermined distance.

9. A system as in claim 8 wherein the monitoring means includes a comparator for comparing the voltage on whichever of the spindle and workpiece is grounded with a second reference voltage and providing a fault signal if the compared voltage exceeds the second reference voltage, the control means limiting movement of the spindle in response to the fault signal.

10. A system as in claim 9 wherein the control means includes variable control means, responsive to the control signal and fault signal, for generating a variable position command signal for moving the spindle by a variable amount toward the workpiece until the drill bit contacts the workpiece, and processor means for generating a fixed position command signal for moving the spindle by a predetermined amount toward the workpiece.

11. A system as in claim 10 wherein:
   the processor means generates a position command signal for moving the spindle by a first predetermined amount during a first time period, maintaining the spindle in a predetermined position for a second time period and moving the spindle by a second predetermined amount during a third time period, the second perdetermined amount corresponding to the desired drilling depth; and
   the variable control means generates the variable position command signal during the second time period.

* * * * *